US006117754A

United States Patent [19]

Wu

[11] Patent Number: 6,117,754

[45] Date of Patent: *Sep. 12, 2000

[54] TRENCH FREE PROCESS FOR SRAM WITH BURIED CONTACT STRUCTURE

[75] Inventor: Shye-Lin Wu, Hsinchu, Taiwan

[73] Assignee: Texas Instruments - Acer Incorporated, Hsinchu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 09/076,024

[22] Filed: May 11, 1998

[51] Int. Cl.[7] .................... H01L 21/3205; H01L 21/4763

[52] U.S. Cl. .......................... 438/586; 438/533; 438/526; 438/652; 438/230; 438/305

[58] Field of Search .................................... 438/586, 530, 438/238, 197, 297, 142, 305, 652, 453, 524, 533, 526, 597

[56] References Cited

U.S. PATENT DOCUMENTS

| | | | |
|---|---|---|---|
| 4,701,423 | 10/1987 | Szluk . | |
| 5,082,796 | 1/1992 | El-Diwany et al. . | |
| 5,525,552 | 6/1996 | Huang | 438/297 |
| 5,580,806 | 12/1996 | Chang et al. | 438/305 |
| 5,607,881 | 3/1997 | Haung et al. | 438/238 |
| 5,652,152 | 7/1997 | Pan et al. | 438/280 |
| 5,652,160 | 7/1997 | Lin et al. | 438/297 |
| 5,654,240 | 8/1997 | Lee et al. . | |
| 5,686,336 | 11/1997 | Lee . | |
| 5,705,437 | 1/1998 | Wu et al. . | |
| 5,780,331 | 7/1998 | Liaw et al. | 438/238 |
| 5,888,887 | 3/1999 | Li et al. | 438/525 |
| 5,926,706 | 7/1999 | Liaw et al. | 438/238 |
| 5,998,269 | 12/1999 | Huang et al. | 438/282 |

*Primary Examiner*—Charles Bowers
*Assistant Examiner*—Thanh Nguyen
*Attorney, Agent, or Firm*—Harness, Dickey & Pierce, P.L.C.

[57] ABSTRACT

The present invention provides a method of forming buried contacts on a semiconductor substrate. The steps are as follows. At first, a gate insulator layer is formed over the substrate. A first silicon layer is then formed over the gate insulator layer. A buried contact opening is defined through the first silicon layer and the gate insulator layer extending down to the substrate. The substrate is then doped with a region under the buried contact opening for forming a buried contact region. A second silicon layer is formed over the substrate and the first silicon layer. A portion of the second silicon layer is then removed to define a gate region and an interconnect. Next, the substrate is doped for forming a second doping region under a region uncovered by the gate region and the interconnect. A thermal oxidation process is performed to oxidize an exposed portion of the first silicon layer and a portion of the second silicon layer at a top surface. Sidewall structures are then formed on sidewalls of the interconnect and the gate region. The substrate is doped for forming a third doping region in the second doping region under a region uncovered by the sidewall structures.

21 Claims, 4 Drawing Sheets

24b 34 34 24a 16 12 14 10 22 36

TRENCH FREE PROCESS FOR SRAM WITH BURIED CONTACT STRUCTURE

FIELD OF THE INVENTION

The present invention relates to semiconductor manufacturing processes, and more specifically, to a trench free process for SRAM (static random access memory) with buried contact structure.

BACKGROUND OF THE INVENTION

From the first invention of integrated circuits in 1960, the number of devices on a chip has grown at an explosively increasing rate. Technologies of the semiconductor industry has been researched continuously for almost four decades. The progress of semiconductor integrated circuits has achieved the ULSI (ultra large scale integration) level or even a higher level. The capacity of a single semiconductor chip increases from several thousand devices to hundreds of million devices, or even billions of devices. Integrated circuit devices like transistors, capacitors, and connections must be greatly narrowed simultaneously to achieve such a high packing density.

The increasing packing density of the integrated circuits generates numerous challenges to the semiconductor manufacturing process. Every device needs to be formed within a smaller size without damaging characteristics and functional operations. The demands on high packing density and low heat generation devices with good reliability and long operation life must be maintained without any degradation in their functions.

All the challenges and demands in fabrication are expected to be solved with the four key aspects of semiconductor manufacturing, including the lithography, the film formation, the etching, and the diffusion processing technologies. The continuous increase in the packing density of the integrated circuits must be accompanied with a smaller feature size. In addition to chip area and functional considerations, all the devices with smaller size must be achieved with simplified and reliable manufacturing steps to raise the yield and reduce the cost of products.

In the application of memory devices, the SRAM device plays a vital role as a semiconductor storage cell in which the stored data can be latched without degradation, as long as the power is maintained. Typically, a SRAM cell is composed of bistable transistor flip-flops which can be implemented in various configurations. MOS (metal oxide semiconductor) transistors or bipolar transistors are used in the bistable transistor flip-flops. The SRAM cell utilizes more transistors than a typical DRAM (dynamic random memory) cell which has only one transistor and one capacitor in general. With more transistors employed in forming memory arrays, the packing density of the SRAM array is of great consideration. The packing density must be raised greatly to include more memory cells in a single chip.

The buried contact technology, which utilizes doped polycrystalline silicon or titanium nitride (TiN) layers for local interconnect, has been widely applied to the modern integrated circuits, such as SRAM and BiCMOS devices. In U.S. Pat. No. 4,701,423 to N. J. Szluk, a totally self-aligned CMOS process is disclosed. It is disclosed that the buried contacts or self-aligned buried contacts is one of the beneficial structures in improving device performance and device density. However, it is difficult to implement the buried contacts with some other beneficial structures like LDD (lightly doped drain), gate/conductor doping, and self-aligned contacts. The process complexity is increased and the device yields is hard to maintain. A CMOS process which incorporates lightly doped drain-source structures, sidewall oxide structures and self-aligned contacts is disclosed in the invention.

M. H. El-Downy et al. disclose the use of polysilicon layer for local interconnect in a CMOS or BiCMOS technology incorporating sidewall spacers in U.S. Pat. No. 5,082,796. It is addressed that the number of metal layers formed on a given portion of a wafer is limited. Therefore, the use of a polysilicon layer for local interconnect allows the metal layer that was formerly used for local interconnect to be employed as an additional global connection layer. The use of a polysilicon layer to form device contacts also results in an improvement in transistor performance through reduction in device parasitic areas.

The buried contacts provide the electrical interconnection among gate electrodes, drain regions of the cross-coupled MOS transistors and source/drain regions of the transmission-gate transistors. However, the typical buried contacts has a major problem in the formation of the buried contact trench which interrupts the transistor current flow path causing device failure.

In U.S. Pat. No. 5,686,336 to J. T. Lee, a method of manufacturing four transistor SRAM cell layout is proposed. A set of cross-coupled inverters provide a bistable flip flop formed on a semiconductor substrate with a pair of FOX regions defining an area on the surface of a substrate. A method of fabrication of the SRAM silicon device including a plurality of FET transistors is also provided.

J. M. Huang discloses a method of reducing buried contact resistance in SRAM in U.S. Pat. No. 5,607,881. It is addressed that the shift of the mask by mis-alignment in the lithography process leads to the undesired expose of a portion of the semiconductor substrate within the buried contact area. During polysilicon over-etching, a buried contact trench will be etched and the current path directed through a less-doping region. The resistance of the contact is increased, leading to decreased device performance. A method employing an extra implant around the trench to solve the resistance problem is proposed in his invention.

In U.S. Pat. No. 5,580,806 to T. T. Chang et al., a method of fabricating a buried contact structure for SRAM is disclosed. The buried contacts are used in a MOS SRAM cell, which employs two loads and two cross-coupled MOS transistors to connect each gate electrode to the drain region of the opposing cross-coupled MOS transistors. The trench formation problem in conventional application of the buried contact technology is also illustrated in the invention. The resistance is increased under the reduction of the impurity dosage.

U.S. Pat. No. 5,654,240 to K. H. Lee and C.-H. D. Yu teaches an integrated circuit fabrication having contact opening. The problem of photoresist mis-alignment which leads to junction trenching defect is introduced. The trenching is found to damage the electrical characteristics of the junction and, under worst circumstances, may completely penetrate junction. The proposed method includes subsequent patterning of the silicide layer using an oxide hard mask to provides electrical contact between the polysilicon layer and the substrate without the risk of trenching into the substrate.

Y. H. Wu et al. disclose a trench free process for SRAM in U.S. Pat. No. 5,705,437. The formation of an undoped region or a trench is introduced to increase the electrical resistivity or leakage problem. However, the conventional processes in solving the trench formation problem generally incorporate complicated processing steps. The efforts needed in fabrication are thus increased as well as the cost. What is needed is a method to form trench-free buried contacts with a simplified process.

SUMMARY OF THE INVENTION

A method for eliminating a buried contact trench in SRAM devices is disclosed in the present invention. A simpler process than conventional buried contact process is provided.

The present invention provides a method of forming buried contacts on a semiconductor substrate. The steps are as follows. At first, a gate insulator layer is formed over the substrate. A first silicon layer is then formed over the gate insulator layer. A buried contact opening is defined through the first silicon layer and the gate insulator layer extending down to the substrate. The substrate is then doped with a region under the buried contact opening for forming a buried contact region. A second silicon layer is formed over the substrate and the first silicon layer. A portion of the second silicon layer is then removed to define a gate region and an interconnect.

Next, the substrate is doped for forming a second doping region under a region uncovered by the gate region and the interconnect. A thermal oxidation process is performed to oxidize an exposed portion of the first silicon layer and a portion of the second silicon layer at a top surface. Sidewall structures are then formed on sidewalls of the interconnect and the gate region. The substrate is doped for forming a third doping region in the second doping region under a region uncovered by the sidewall structures.

In addition to the buried contact, one or more interconnecting layers can be formed. A dielectric layer is formed over the substrate after the third doping region is formed. A thermal annealing process is then performed. A metallization process can then be performed for forming connections.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED DESCRIPTION OF THE PREFERRED EMBODIMENT

A method for eliminating a buried contact trench in SRAM devices is disclosed in the present invention. A more simplified process than conventional buried contact process is provided. The packing density in forming SRAM or BiCMOS transistors can be increased with less efforts in processing steps.

Figure 1:
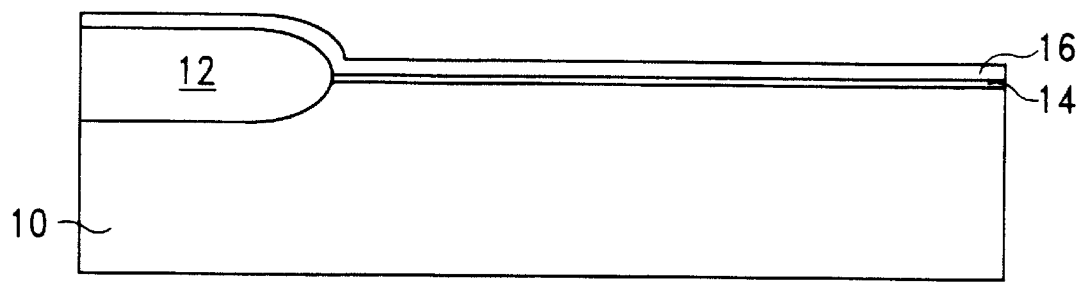
FIG. 1 illustrates a cross-sectional view of forming a gate insulator layer and a first silicon layer on a substrate in accordance with the present invention.

Referring to FIG. 1, a semiconductor substrate 10 with a preferable single crystalline silicon in a <100> direction is provided. For different applications or specifications, a substrate with different crystalline orientations or materials can be used alternatively. An isolation region using field oxide isolation 12 or other isolation technology like trench isolation (not shown) is formed on the substrate 10. A gate insulator layer 14 is formed over the substrate 10. In the case, a thin oxide layer can be used. The oxide layer 14 can be thermally grown from the substrate 10 with a thickness ranging from about 50 angstroms to 400 angstroms. A wet oxidation or a dry oxidation process can be employed to grow the oxide layer 14.

A first silicon layer 16 is than formed over the gate insulator layer 14. The first silicon layer 16 can be an undoped poly-crystalline silicon layer. The formation of the thin silicon layer 16 can be served as a buffer layer to protect the substrate 10 from contamination pollutions in later lithography processes. The silicon layer 16 can be further utilized as a portion of the gate electrode and interconnect. The undoped poly-crystalline silicon layer 16 can be formed by chemical vapor deposition with silicon containing reactants. In the preferred embodiments, a thin poly-crystalline silicon layer with a thickness between about 10 nm to 50 nm is formed.

Figure 2:
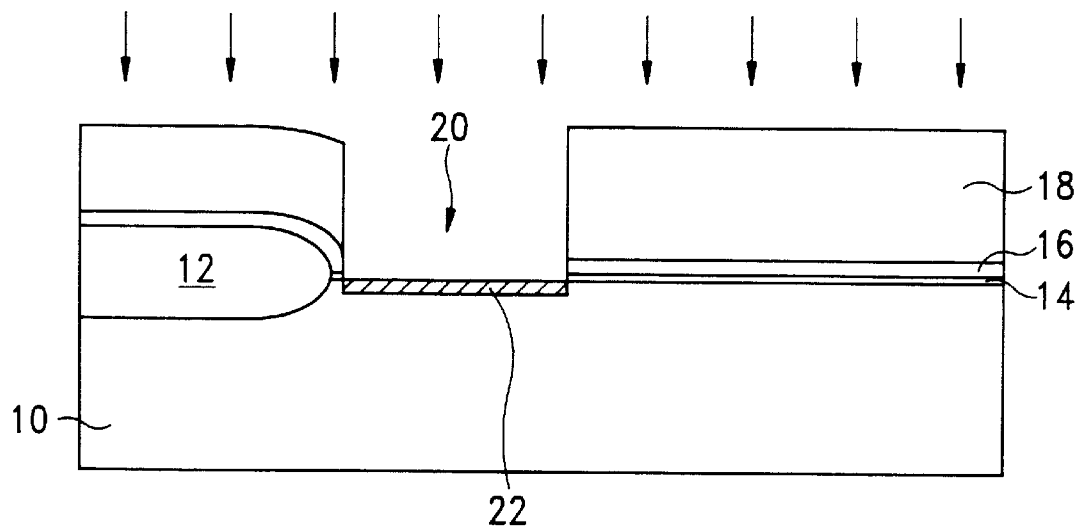
FIG. 2 illustrates a cross-sectional view of defining a buried contact opening through the first silicon layer and the gate insulator layer down to the substrate in accordance with the present invention.

Referring to FIG. 2, a buried contact opening 20 is defined through the first silicon layer 16 and the gate insulator layer 14 down to the substrate 10. The buried contact opening 20 can be defined by a patterning process which is well known in the art. A photoresist layer 18 can be formed over the first silicon layer 16. The photoresist layer 18 is then defined with the transfer of a mask pattern by a lithography process. After the photoresist layer 18 is developed, it is used as a mask for etching the first silicon layer 16 and the gate insulator layer 14. A reactive ion etching (RIE) can be performed preferably to etch out the buried contact opening 20. With the buffering of the silicon layer 16, the photoresist contamination problem to the substrate 10 can be eliminated.

The substrate 10 is then doped for forming a buried contact region 22 under the buried contact opening 20. An ion implantation can be performed using the photoresist layer 18 as a mask. Dopants like phosphorus or arsenic containing dopants can be implanted to form the n-doped buried contact region 22. The dopants can be implanted at an energy between about 10 KeV to 100 KeV to have a dose between about 5E14 to 5E16 atoms/$cm^2$.

Figure 3:
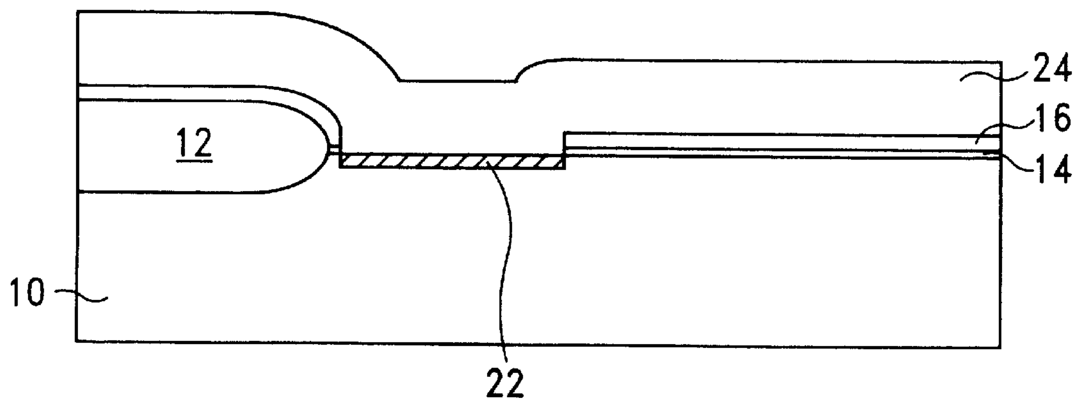
FIG. 3 illustrates a cross-sectional view of forming a second silicon layer over the substrate and the first silicon layer in accordance with the present invention.

A second silicon layer 24 is then formed over the substrate 10 and the first silicon layer 16, as shown in FIG. 3. In this case, the second silicon layer 24 is an undoped poly-crystalline silicon layer. The undoped poly-crystalline silicon layer is also formed by chemical vapor deposition. In this case, the second silicon layer 24 is formed with a thickness between about 500 angstroms to about 3,000 angstroms.

Figure 4:
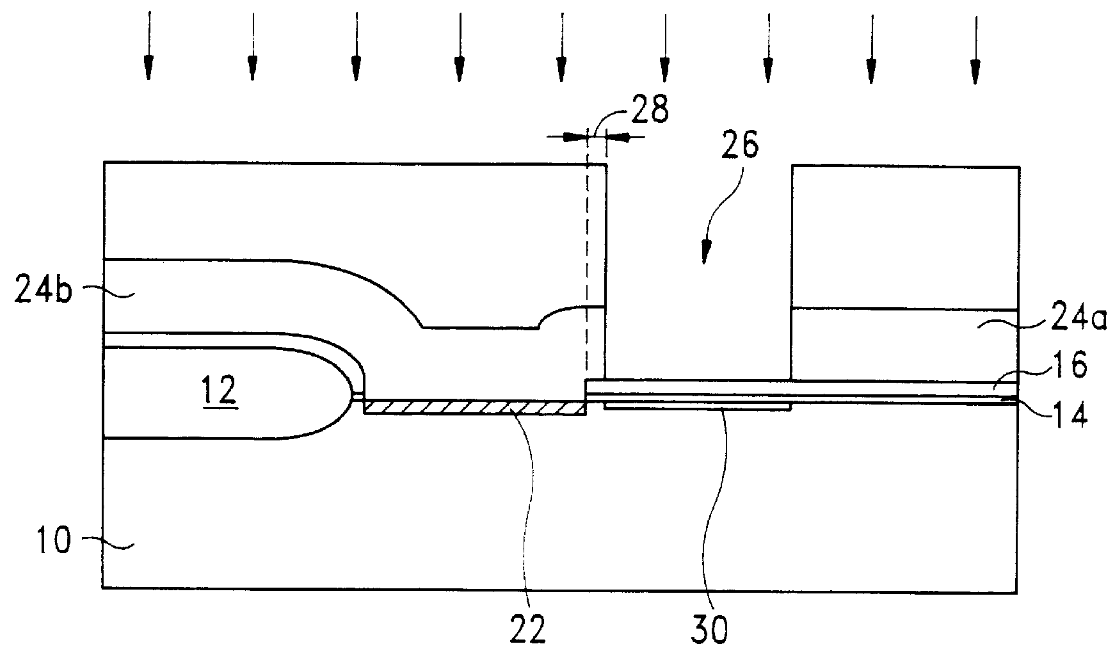
FIG. 4 illustrates a cross-sectional view of removing a portion of the second silicon layer to define a gate region and an interconnect in accordance with the present invention.

Referring to FIG. 4, a portion of the second silicon layer 24 is then removed to define a gate region 24$a$ and an interconnect 24$b$. A well-known patterning process can be used to define which portion to etch-off by the lithography process. An etching process, like a RIE etching process follows to define the gate region 24$a$ and the interconnect 24$b$. A window 26 for doping a lightly doped junction region is opened between the gate region 24$a$ and the interconnect 24$b$. In general, a very thin native oxide is formed between the first silicon layer 16 and the second silicon layer 24. In etching the window 26, the etching process can be well controlled by detecting the signal of reaching the native oxide between the first silicon layer 16 and the second silicon layer 24. Moreover, in the condition of undesired over-etching, the substrate 10 can still protected well by the thin silicon layer 16. Thus the etching process can be controlled easily with an improved process window.

A narrow tolerate space 28 can be set between the window 26 and the buried contact region 22 in defining the window 26. In this case, a space of about several hundred angstroms or smaller can be defined. The space can improve the tolerance to the position shifting under mis-alignment in the lithography process. Therefore, the buried contact region 22 can be protected from undesired etching and the trenching problem of the conventional process can be eliminated.

Next, the substrate 10 are doped for forming a second doping region 30 under a region uncovered by the gate region 24$a$ and the interconnect 24$b$. The second doping region 30 is a lightly doped drain/source (LDD) region for a transistor structure. An ion implantation can be performed with dopants like phosphorus or arsenic containing dopants. The dopants can be implanted at an energy between about 10 KeV to 80 KeV to have a dose between about 5E12 to 5E14 atoms/cm$^2$.

Figure 5:
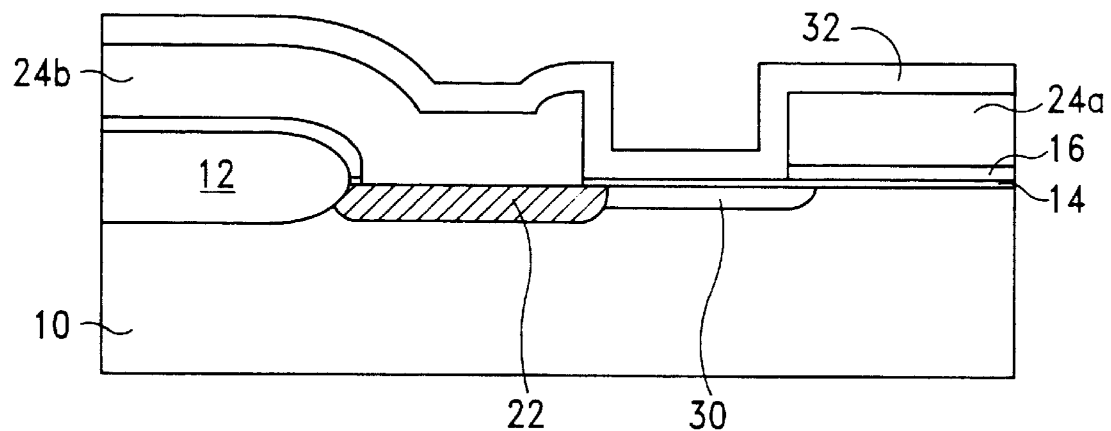
FIG. 5 illustrates a cross-sectional view of oxidizing an exposed portion of the first silicon layer and a portion of the second silicon layer at a top surface in accordance with the present invention.

Turning to FIG. 5, a thermal oxidation process is performed to oxidize an exposed portion of the first silicon layer 16 and a portion of the second silicon layer 24 at a top surface. An oxide layer 32 is formed with a high temperature thermal process with a temperature of about 750° C. to about 1150° C. The dopants in the buried contact region 22 and the second doping region 30 is diffused and activated at the same time. Thus the buried contact region 22 and the second doping region 30 is conductively coupled after the thermal process. The etching damage to the gate region 24$a$ and the interconnect 24$b$ in previous etching step can also be recovered with the thermal process.

Figure 6:
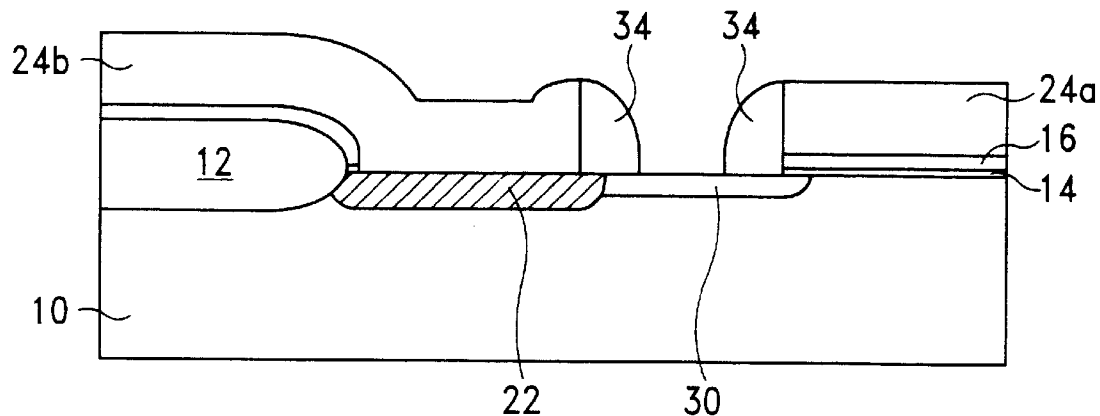
FIG. 6 illustrates a cross-sectional view of forming sidewall structures on sidewalls of the interconnect and the gate region in accordance with the present invention.

Referring to FIG. 6, sidewall structures 34 are formed on sidewalls of the interconnect 24$b$ and the gate region 24$a$. The sidewall structures 34 can be oxide spacers which are formed by depositing and etching back an oxide layer. The major portion of the oxide layer 32 are removed in the etching back process and the remaining oxide is left in the sidewall structures 34.

Figure 7:
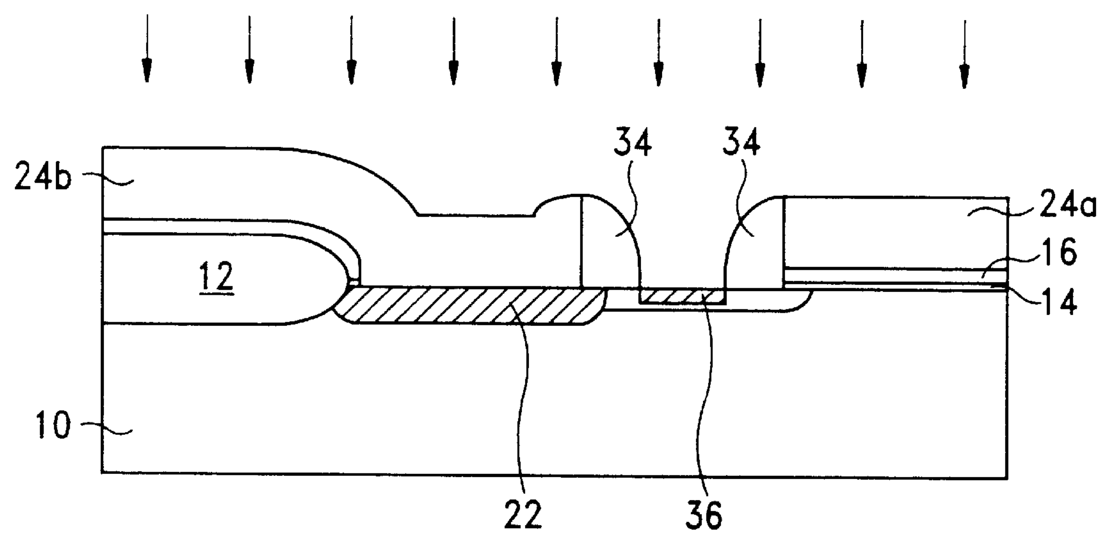
FIG. 7 illustrates a cross-sectional view of doping the substrate for forming a third doping region in the second doping region under a region uncovered by the sidewall structures in accordance with the present invention.

The substrate 10 is then doped for forming a third doping region 36 in the second doping region 30 under a region uncovered by the sidewall structures 34, as shown in FIG. 7. The gate region 24$a$ and the interconnect 24$b$ are also doped as well to be highly conductive. The third doping region 36 serves as a source/drain junction region with a high dose for a transistor. An ion implantation can be performed using the sidewall structures 34 as a mask. Dopants like phosphorus or arsenic containing dopants can be implanted to form the junction region 38. The dopants can be implanted at an energy between about 10 KeV to 100 KeV to have a dose between about 5E14 to 5E16 atoms/cm$^2$. Thus a transistor structure with LDD (lightly doped drain) structure and the buried contact is formed for high performance applications like SRAM devices.

Figure 8:
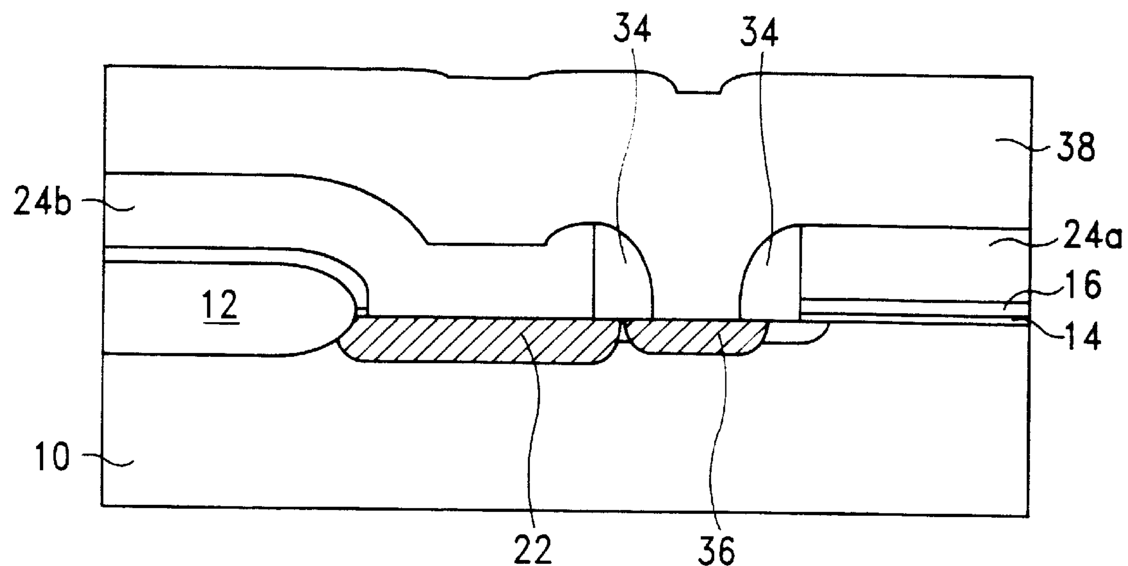
FIG. 8 illustrates a cross-sectional view of forming a dielectric layer over the substrate after the third doping region is formed in accordance with the present invention.
Figure 9:
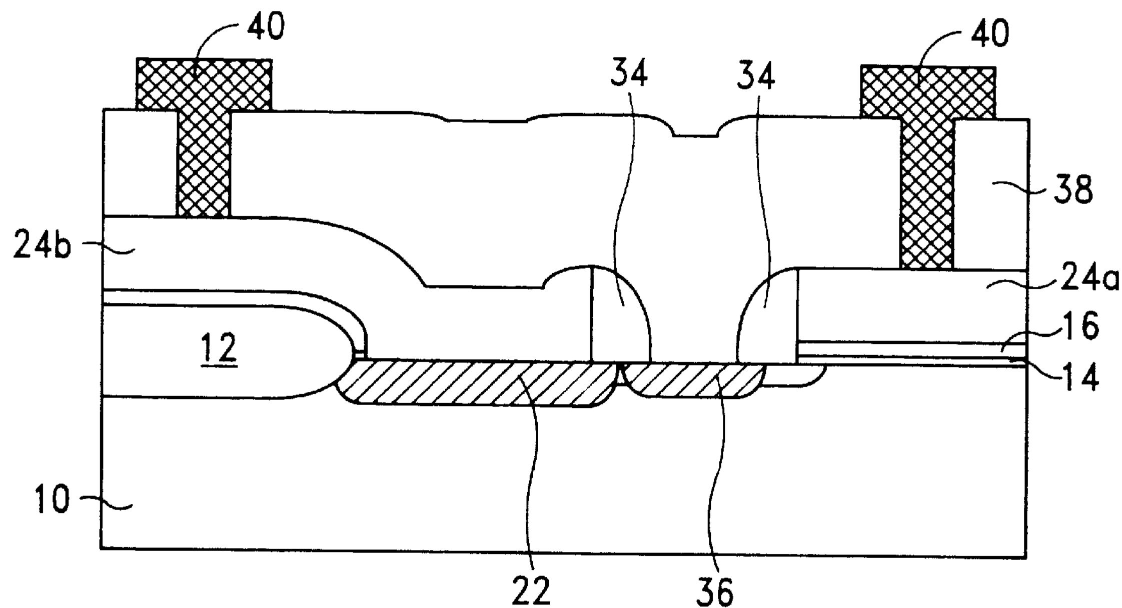
FIG. 9 illustrates a cross-sectional view of performing a metallization process for forming connections in accordance with the present invention.

In addition to the local interconnections formed by buried contacts, one or more layers of global interconnections can be formed over the substrate 10 to finish the whole integrated circuit. Referring to FIG. 8, a dielectric layer 38 is formed over the substrate 10. In general, a chemical vapor deposited oxide layer can be utilized as the dielectric layer 40. In this case, a NSG or BPSG (borophosphosilicate) layer can be deposited. A thermal anneal process is then performed to planarize device morphology and to activate dopants, at a temperature of between about 800° C. and about 950° C. is then performed. The dopants in the third doping region 36 are diffused and activated. Next, a metallization process is then performed for forming connections 40. The connections are formed in the dielectric layer 38 to have conductive couplings to the interconnect 24$b$ of buried contact and to the gate region 24$a$. Thus the transistor device with buried contact and layers of connections is formed. The buried contact region 22 is formed to be electrically conductive with the junction region 30 and 36 without any high resistance barrier or trench in-between. The trench formation problem in the conventional process can be eliminated. A trench free buried contact is provided with benefits on conductivity and reliability.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method of forming buried contacts on a semiconductor substrate, said method comprising the steps of:

forming a gate insulator layer over said substrate;

forming a first silicon layer over said gate insulator layer;

defining a buried contact opening through said first silicon layer and said gate insulator layer down to said substrate;

doping said substrate under said buried contact opening for forming a buried contact region;

forming a second silicon layer over said substrate and said first silicon layer;

removing a portion of said second silicon layer to form a window between two uncovered vertical sides of said second silicon layer and down to an exposed surface portion of said first silicon layer for defining a gate region and an interconnect;

doping said substrate for forming a second doping region under a region uncovered by said gate region and said interconnect;

performing a thermal oxidation process to oxidize said exposed surface portion of said first silicon layer, said two uncovered vertical sides and a surface portion of said second silicon layer for forming an oxide layer thereon;

etching said oxide layer immediately after said thermal oxidation process for forming sidewall structures on sidewalls of said interconnect and said gate region; and doping said substrate for forming a third doping region in said second doping region under a region uncovered by said sidewall structures.

2. The method of claim 1 further comprises the steps of:

forming a dielectric layer over said substrate after said third doping region is formed;

performing a thermal annealing process; and performing a metallization process for forming connections.

3. The method of claim 2, wherein said dielectric layer comprises a NSG layer or a BPSG layer.

4. The method of claim 1, wherein said gate insulator layer comprises an oxide layer which is thermally grown from said semiconductor substrate.

5. The method of claim 1, wherein said first silicon layer comprises an undoped poly-crystalline silicon layer which is formed by chemical vapor deposition.

6. The method of claim 1, wherein said first silicon layer has a thickness between about 10 nm to 50 nm.

7. The method of claim 1, wherein said buried contact region is formed by an ion implantation with phosphorus or arsenic containing dopants at an energy between about 10 KeV to 100 KeV to have a dose between about 5E14 to 5E16 atoms/cm$^2$.

8. The method of claim 1, wherein said second silicon layer comprises an undoped poly-crystalline silicon layer which is formed by chemical vapor deposition.

9. The method of claim 1, wherein said second doping region is formed by an ion implantation with phosphorus or arsenic containing dopants at an energy between about 10 KeV to 80 KeV to have a dose between about 5E12 to 5E14 atoms/cm$^2$.

10. The method of claim 1, wherein said sidewall structures comprise oxide spacers which are formed by depositing and etching back an oxide layer.

11. The method of claim 1, wherein said third doping region is formed by an ion implantation with phosphorus or arsenic containing dopants at an energy between about 10 KeV to 100 KeV to have a dose between about 5E14 to 5E16 atoms/cm$^2$.

12. A method of forming buried contacts on a semiconductor substrate, said method comprising the steps of:

forming a gate insulator layer over said substrate;

forming a first silicon layer over said gate insulator layer;

defining a buried contact opening through said first silicon layer and said gate insulator layer down to said substrate;

doping said substrate under said buried contact opening for forming a buried contact region with phosphorus or arsenic containing dopants;

forming a second silicon layer over said substrate and said first silicon layer;

removing a portion of said second silicon layer to form a window between two uncovered vertical sides of said second silicon layer and down to an exposed surface portion of the first silicon layer for defining a gate region and an interconnect;

doping said substrate for forming a second doping region with said phosphorus or said arsenic containing dopants under a region uncovered by said gate region and said interconnect;

performing a thermal oxidation process to oxidize said exposed surface portion of said first silicon layer, said two uncovered vertical sides and a surface portion of said second silicon layer for forming an oxide layer thereon, and concurrently to diffuse and activate dopants in said buried contact region and said second doping region;

etching said oxide layer immediately after said thermal oxidation process for forming sidewall structures on sidewalls of said interconnect and said gate region;

doping said substrate for forming a third doping region with said phosphorus or said arsenic containing dopants in said second doping region under a region uncovered by said sidewall structures;

forming a dielectric layer over said substrate;

performing a thermal annealing process; and performing a metallization process for forming connections.

13. The method of claim 12, wherein said dielectric layer comprises a NSG layer or a BPSG layer.

14. The method of claim 12, wherein said gate insulator layer comprises an oxide layer which is thermally grown from said semiconductor substrate.

15. The method of claim 12, wherein said first silicon layer comprises an undoped poly-crystalline silicon layer which is formed by chemical vapor deposition.

16. The method of claim 12, wherein said first silicon layer has a thickness between about 10 nm to 50 nm.

17. The method of claim 12, wherein said buried contact region is formed by an ion implantation at an energy between about 10 KeV to 100 KeV to have a dose between about 5E14 to 5E16 atoms/cm$^2$.

18. The method of claim 12, wherein said second silicon layer comprises an undoped poly-crystalline silicon layer which is formed by chemical vapor deposition.

19. The method of claim 12, wherein said second doping region is formed by an ion implantation at an energy between about 10 KeV to 80 KeV to have a dose between about 5E12 to 5E14 atoms/cm$^2$.

20. The method of claim 12, wherein said sidewall structures comprise oxide spacers which are formed by depositing and etching back an oxide layer.

21. The method of claim 12, wherein said third doping region is formed by an ion implantation at an energy between about 10 KeV to 100 KeV to have a dose between about 5E14 to 5E16 atoms/cm$^2$.

* * * * *